(12) United States Patent
Cheng et al.

(10) Patent No.: US 10,297,507 B2
(45) Date of Patent: May 21, 2019

(54) SELF-ALIGNED VERTICAL FIELD-EFFECT TRANSISTOR WITH EPITAXIALLY GROWN BOTTOM AND TOP SOURCE DRAIN REGIONS

(71) Applicant: International Business Machines Corporation, Armonk, NY (US)

(72) Inventors: Kangguo Cheng, Schenectady, NY (US); Shogo Mochizuki, Clifton Park, NY (US); Tenko Yamashita, Schenectady, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/786,047

(22) Filed: Oct. 17, 2017

(65) Prior Publication Data

US 2019/0115452 A1 Apr. 18, 2019

(51) Int. Cl.
*H01L 21/336* (2006.01)
*H01L 21/8234* (2006.01)
*H01L 29/66* (2006.01)
*H01L 29/78* (2006.01)
*H01L 21/3105* (2006.01)
*H01L 21/311* (2006.01)
*H01L 29/423* (2006.01)

(52) U.S. Cl.
CPC ............... *H01L 21/823487* (2013.01); *H01L 29/66666* (2013.01); *H01L 29/66787* (2013.01); *H01L 29/7827* (2013.01); *H01L 21/31051* (2013.01); *H01L 21/31144* (2013.01); *H01L 29/42376* (2013.01)

(58) Field of Classification Search
CPC ....... H01L 21/823487; H01L 29/42392; H01L 29/42376; H01L 29/66666; H01L 29/66787; H01L 29/7827; H01L 29/7828; H01L 29/78642
See application file for complete search history.

(56) References Cited

U.S. PATENT DOCUMENTS

| | | | |
|---|---|---|---|
| 6,770,534 | B2 | 8/2004 | Cho et al. |
| 7,683,428 | B2 | 3/2010 | Chidambarrao et al. |

(Continued)

*Primary Examiner* — Eric A. Ward
(74) *Attorney, Agent, or Firm* — Amin, Turocy & Watson, LLP

(57) ABSTRACT

A vertical FET structure includes a bottom source-drain region disposed on a substrate of the first type; a recessed first heterostructure layer disposed on the bottom source-drain region; a first fin disposed on the bottom source-drain region; a dielectric inner spacer disposed on the recessed first heterostructure; an outer spacer disposed on the inner spacer; a high-k and metal gate layer disposed on the outer spacer, the inner spacer, and the channel layer; an interlayer dielectric oxide disposed between the first fin and the outer spacer; a recessed second heterostructure layer disposed on top of the substrate of the first type and high-k and metal gate layer; a dielectric inner spacer disposed on the recessed second heterostructure layer; and a top source-drain region layer disposed on the dielectric inner spacer and recessed second heterostructure layer resulting in the vertical FET. A method for forming the vertical FET is also provided.

9 Claims, 15 Drawing Sheets

(56) References Cited

U.S. PATENT DOCUMENTS

| | | |
|---|---|---|
| 8,080,458 B2 | 12/2011 | Masuoka et al. |
| 8,563,379 B2 | 10/2013 | Masuoka et al. |
| 9,431,305 B1 | 8/2016 | Anderson et al. |
| 9,431,505 B2 | 8/2016 | Lim et al. |
| 9,530,700 B1 | 12/2016 | Mallela et al. |
| 9,601,491 B1 | 3/2017 | Mallela et al. |
| 9,653,458 B1 | 5/2017 | Cheng et al. |
| 9,685,537 B1 | 6/2017 | Xie et al. |
| 2006/0261406 A1 | 11/2006 | Chen |
| 2016/0071931 A1* | 3/2016 | Cheng ................ H01L 21/0245 257/329 |
| 2018/0096896 A1* | 4/2018 | Zhu .................... H01L 21/8221 |
| 2018/0097106 A1* | 4/2018 | Zhu .................. H01L 21/02532 |
| 2018/0248018 A1* | 8/2018 | Park ................. H01L 29/66666 |

* cited by examiner

SELF-ALIGNED VERTICAL FIELD-EFFECT TRANSISTOR WITH EPITAXIALLY GROWN BOTTOM AND TOP SOURCE DRAIN REGIONS

FIELD OF THE INVENTION

The present invention relates to an improved vertical field-effect transistor (FET) process. More particularly, the present invention relates to a self-aligned vertical FET with epitaxially grown bottom and top source drain regions.

BACKGROUND

FETs are transistors that use an electrical field to control the electrical behavior of the device. The fin refers in a semiconductor material patterned on a substrate that often has exposed surfaces that form the narrow channel between source and drain region layers. Vertical FETs often include a vertical channel and active source and drain region layers arranged beneath and above the channel. A thin dielectric layer arranged over the fin separates the fin channel from the gate. Like in any transistors, there is a strong need to solve both gate length control and junction position control problems in vertical FETs. In the conventional lateral FinFET transistors, gate length is defined by lithography or sidewall image transfer process. However, in the vertical FET architecture where the channel direction (transport direction) is arranged vertically on the substrate, none of the conventional methods used to define gate length is applicable. The gate spacer thickness and the source-drain extension thickness are also difficult to control in the vertical architecture. It is critical to control them because their thicknesses are closely related to junction positions.

SUMMARY

A method of forming a vertical field-effect transistor (FET), the method includes depositing a first heterostructure layer over a substrate of a first type; depositing a channel layer over the first heterostructure layer; depositing a second heterostructure layer over the channel layer; forming a first fin having a hard mask thereon, wherein the hard mask is disposed on the second heterostructure layer; recessing the first and the second heterostructure layers such that they are narrower than the first fin and the hard mask; filling gaps formed in the recessed first and second heterostructure layers with a dielectric inner spacer; performing oxidation to form $SiO_2$ over the substrate of the first type and the channel layer; depositing a dielectric liner; directionally etching the dielectric liner over the $SiO_2$; etching the $SiO_2$ over the substrate of the first type; epitaxially growing a bottom source-drain region layer over the substrate of the first type; conformally etching back a hard mask liner over the bottom source-drain region layer; depositing an outer spacer on top of the bottom source-drain region layer; removing the $SiO_2$; depositing a high-k dielectric layer and metal gate layer on top of the first heterostructure layer; etching the high-k dielectric layer and metal gate layer to a level below the top hard mask; filling with interlayer dielectric (ILD) oxide and then performing CMP to the top of hard mask; etching the hard mask; and epitaxially growing a top source-drain region layer over the first fin to produce the vertical FET.

A vertical field-effect transistor (FET) structure includes a bottom source-drain region disposed on a substrate of the first type; a recessed first heterostructure layer disposed on the bottom source-drain region; a first fin disposed on the bottom source-drain region; a dielectric inner spacer disposed on the recessed first heterostructure; an outer spacer disposed on the dielectric inner spacer; a high-k and metal gate layer disposed on the outer spacer, the dielectric inner spacer, and the channel layer; an interlayer dielectric (ILD) oxide disposed between the first fin and the outer spacer; a recessed second heterostructure layer disposed on top of the substrate of the first type and high-k and metal gate layer; a dielectric inner spacer disposed on the recessed second heterostructure layer; and a top source-drain region layer disposed on the dielectric inner spacer and recessed second heterostructure layer resulting in the vertical FET.

BRIEF DESCRIPTION OF THE DRAWINGS

Embodiments will be described in more detail in conjunction with the accompanying drawings, in which.

DETAILED DESCRIPTION OF THE PREFERRED EMBODIMENTS

Figure 1:
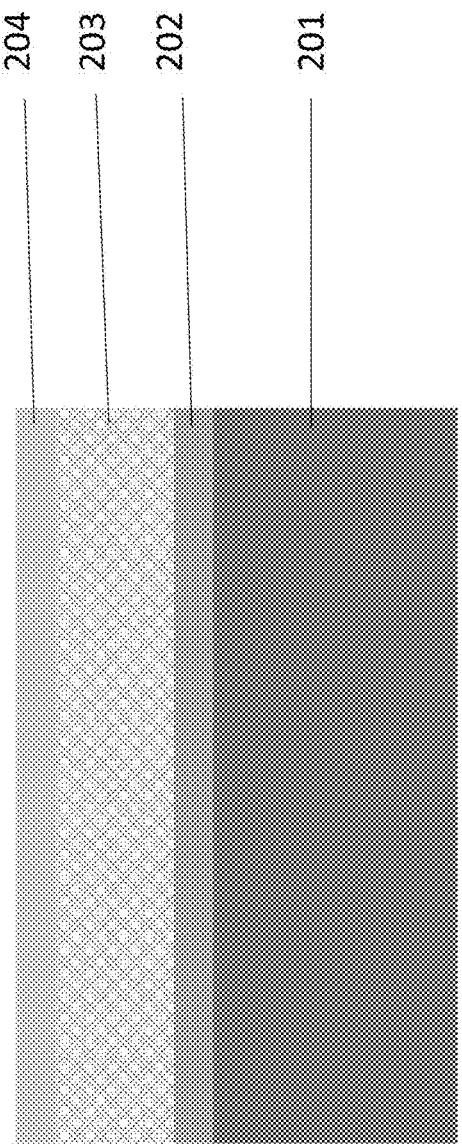
FIG. 1 illustrates a diagram of depositing a first heterostructure layer over a substrate of a first type; depositing a channel layer over the first heterostructure layer; and depositing a second heterostructure layer over the channel layer.

It will be readily understood that components of the present invention, as generally described in the figures herein, can be arranged and designed in a wide variety of different configurations in addition to the presently described preferred embodiments. Thus, the following detailed description of some embodiments of the present invention, as represented in the figures, is not intended to limit the scope of the present invention as claimed, but is merely representative of selected presently preferred embodiments of the present invention.

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others. Deposition also includes a so-called epitaxial growth process which deposits single crystalline material on a single crystalline substrate.

Removal/etching is any process that removes material from the wafer. Examples include etch processes (either wet or dry), and chemical-mechanical planarization (CMP), and the like. A dry etch process such as reactive ion etching (RIE) uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or rapid thermal annealing. Annealing serves to activate the implanted dopants. Selective doping of various layers of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The metal gate layer is electrically insulated from the main semiconductor n-channel or p-channel by a thin layer insulating material, for example, silicon dioxide or high dielectric constant (high-k) dielectrics, which makes the input resistance of the transistor relatively high.

The present invention is to be understood within the context of the description provided below. The description provided below is to be understood within the context of the Figures provided and described above. The Figures are intended for illustrative purposes and, as such, are not necessarily drawn to scale.

FIG. 1 illustrates a diagram of depositing a first heterostructure layer 202 over a substrate of a first type 201, depositing a channel layer 203 over the first heterostructure layer 202, and depositing a second heterostructure 204 layer over the channel layer 203. The first heterostructure layer 202 and second heterostructure layer 204 can either be the same or different materials. The material used for heterostructure layers can be silicon germanium. The heterostructure layer can have a thickness from about 4 to about 10 nm and ranges there between and the thickness of the first and second heterostructure layers can be the same or different. The channel layer 203 can have a thickness from about 10 to about 50 nm and ranges there between. The material used for the channel layer 203 can be a material such as silicon.

Figure 2:
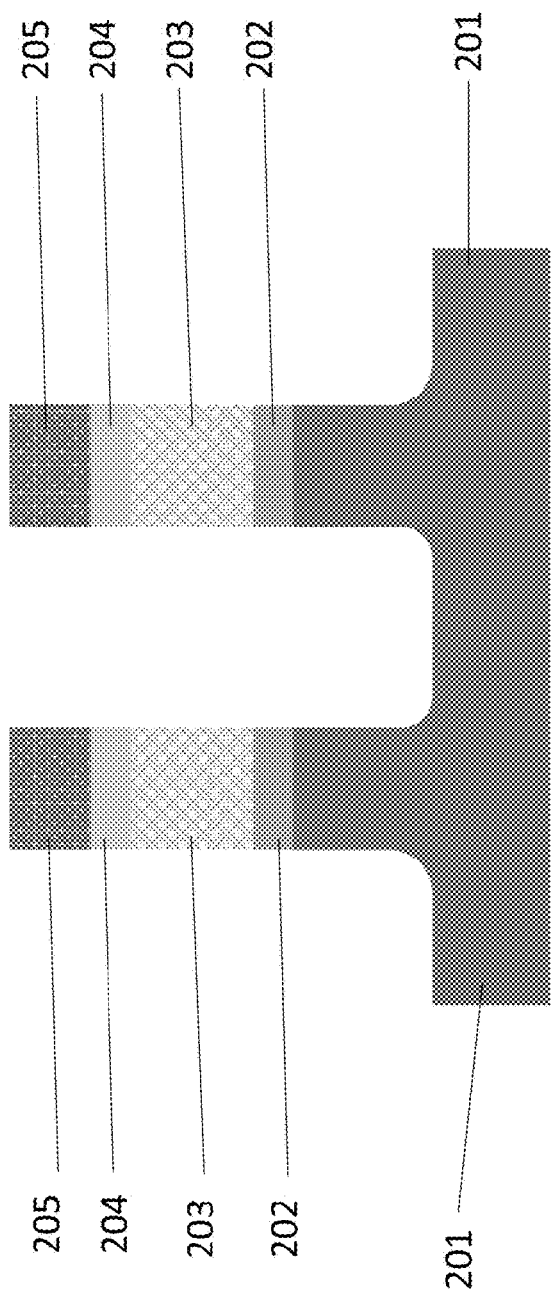
FIG. 2 illustrates a diagram of forming a first fin having a hard mask thereon, wherein the hard mask is disposed on the second heterostructure layer.

FIG. 2 illustrates a diagram of forming a first fin having a hard mask thereon 205, wherein the hard mask is disposed on the second heterostructure layer 204. The hard mask can be silicon nitride. Alternatively, the hard mask 205 can contain multiple materials arranged in any forms, including but not limited to silicon nitride, polysilicon, amorphous silicon, and silicon oxide. The hard mask 205 can have a lateral width from about 5 to about 25 nm and ranges there between. The first fin can be formed by using a reactive ion etching (RIE) process. The hard mask 205 can etched selectively using hot phosphoric acid (H3PO4).

Figure 3:
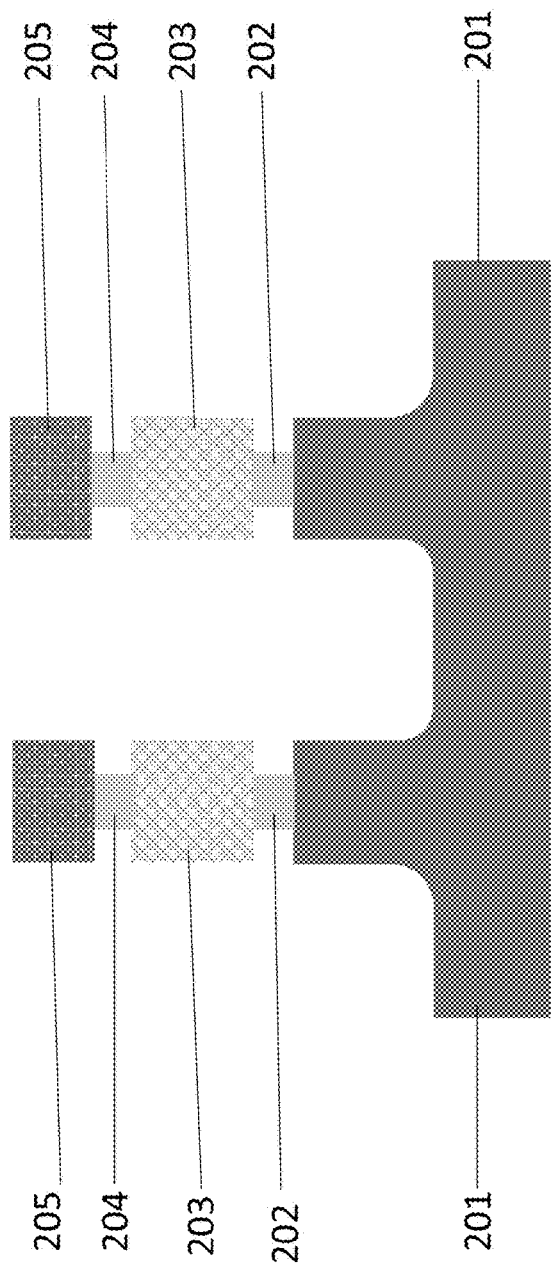
FIG. 3 illustrates a diagram of recessing the first and the second heterostructure layers such that they are narrower than the first fin and the hard mask.
Figure 4:
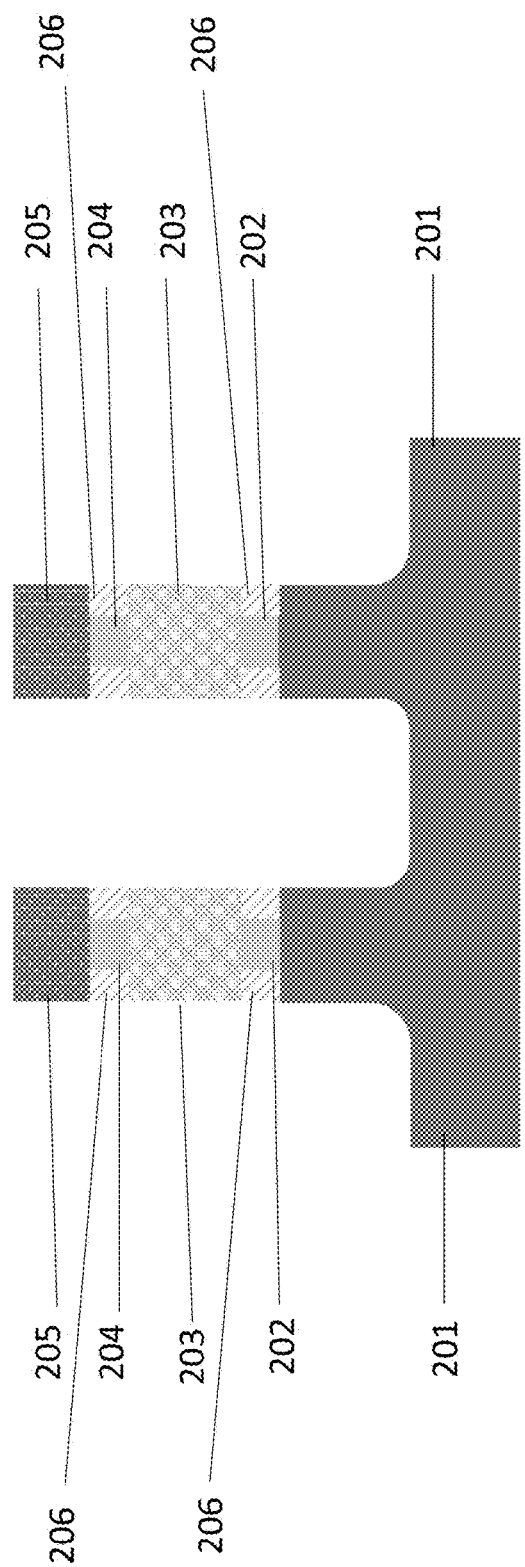
FIG. 4 illustrates a diagram of filling gaps formed in the recessed first and second heterostructure layers with a dielectric inner spacer.

FIG. 3 illustrates a diagram of recessing the first 202 and the second 204 heterostructure layers such that they are narrower than the first fin and the hard mask 205. FIG. 4 illustrates a diagram of filling gaps formed in the recessed first 202 and second 204 heterostructure layers with a dielectric inner spacer 206. This can be done by first conformally depositing inner spacer material to pinch off the gap and then conformally etching back that material on the unwanted surfaces. The etching time can be controlled such that the material filled in the gap remains. The dielectric inner spacer 206 can be a material such as silicon-boron-carbon-nitride (SiBCN) or silicon nitride or SiCO or SiOCN. The shape of the dielectric inner spacer 206 may not be perfectly rectangular as shown in the figures. The interface between dielectric inner spacer 206 and the recessed first heterostructure layer 202 and recessed second heterostructure layer 204 may have a convex shape towards the recessed heterostructure layers due to the nature of recess etching.

Figure 5:
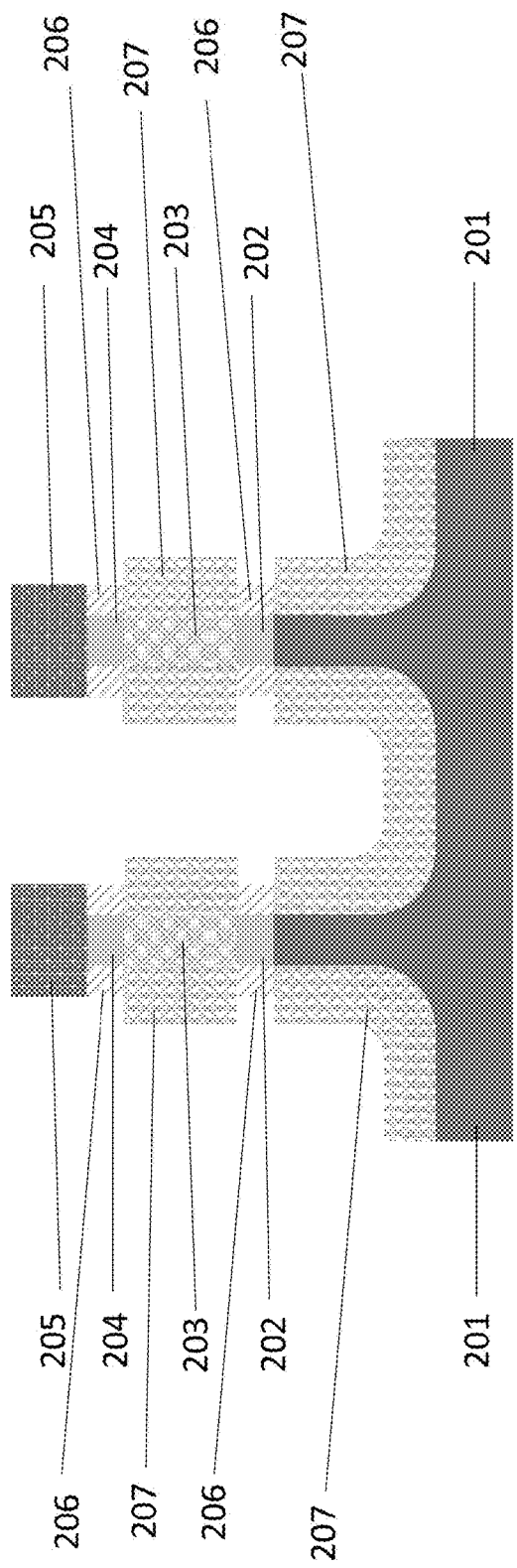
FIG. 5 illustrates a diagram of performing oxidation to form $SiO_2$ over the substrate of the first type and the channel layer.
Figure 6:
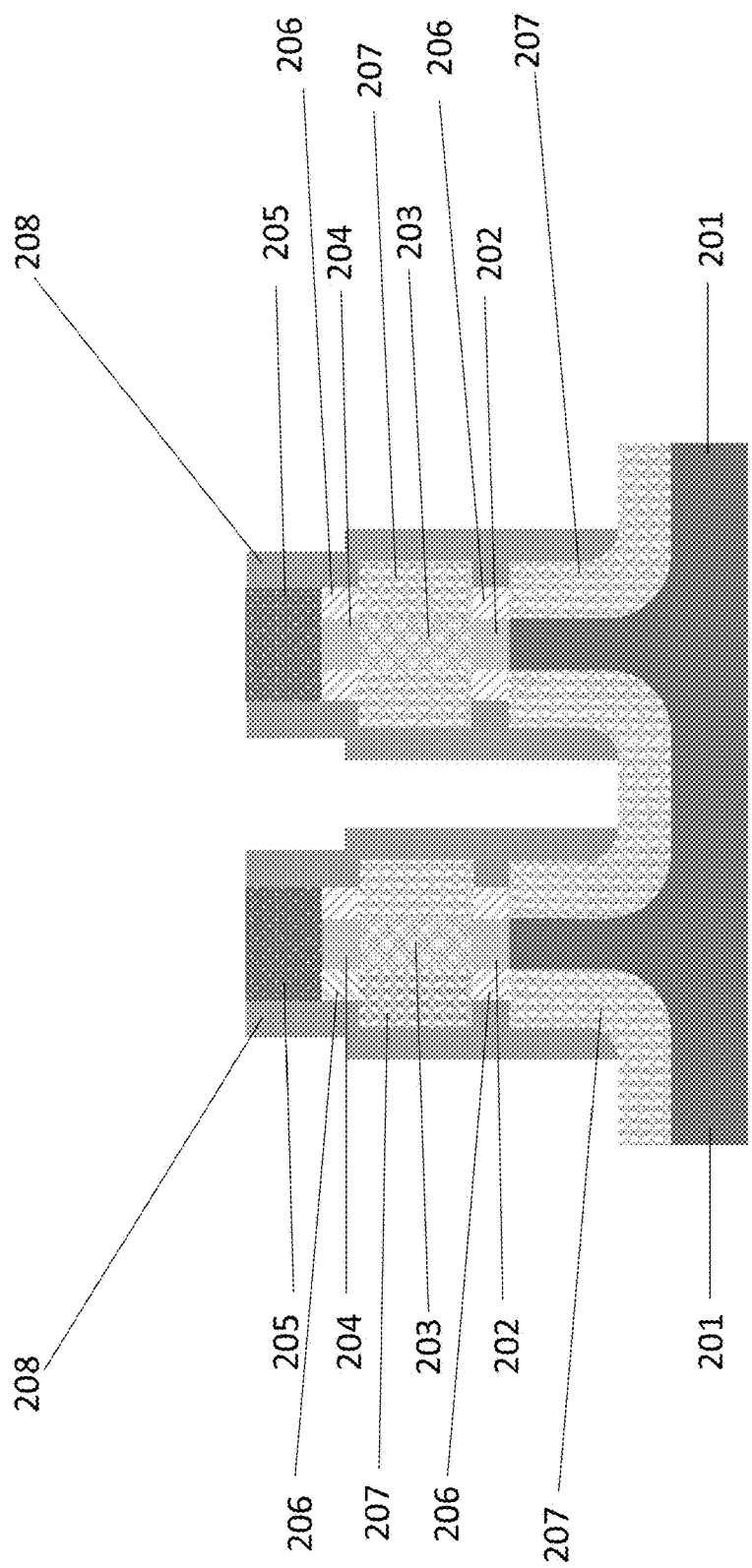
FIG. 6 illustrates a diagram of depositing a dielectric liner and directionally etching it back over the $SiO_2$.
Figure 7:
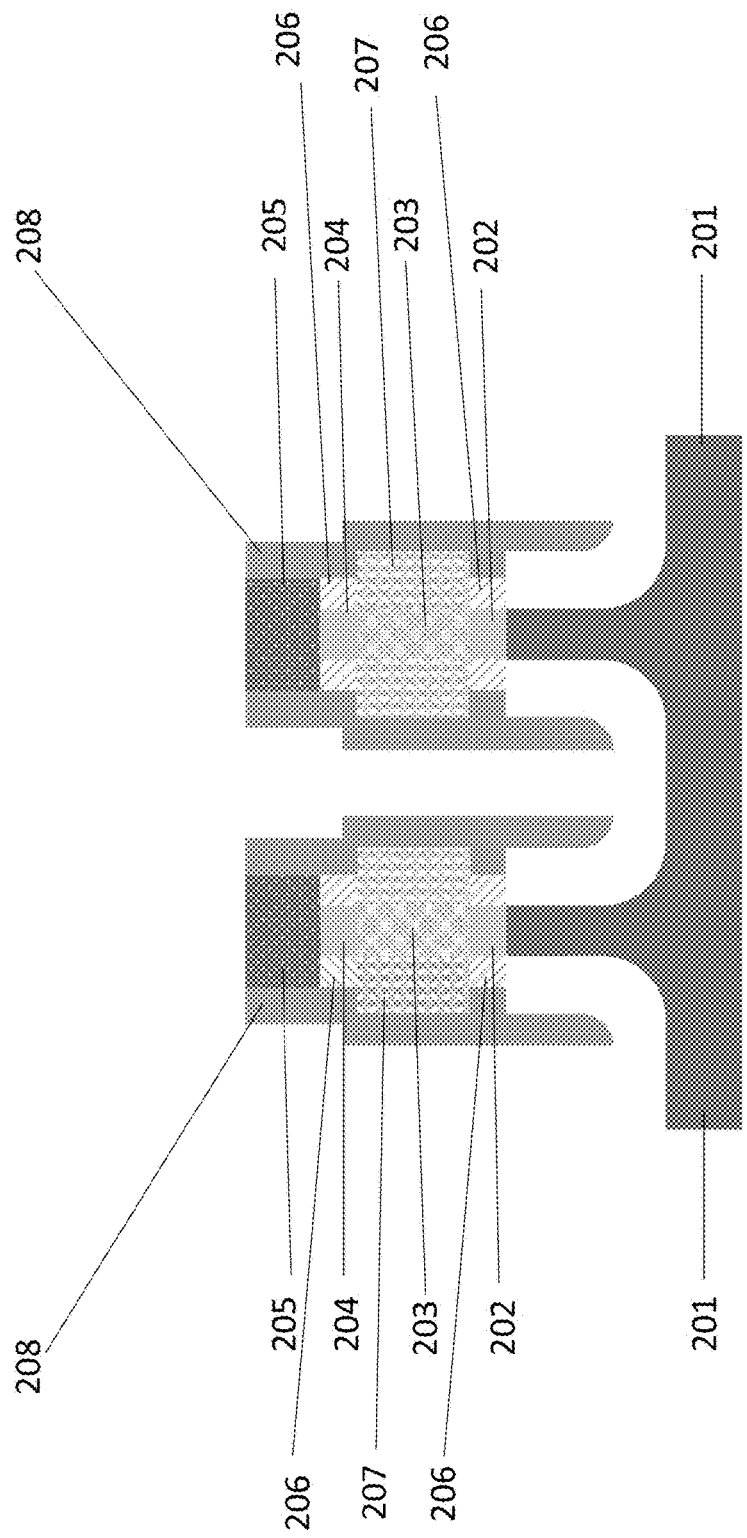
FIG. 7 illustrates a diagram of etching the $SiO_2$ over the substrate of the first type.
Figure 8:
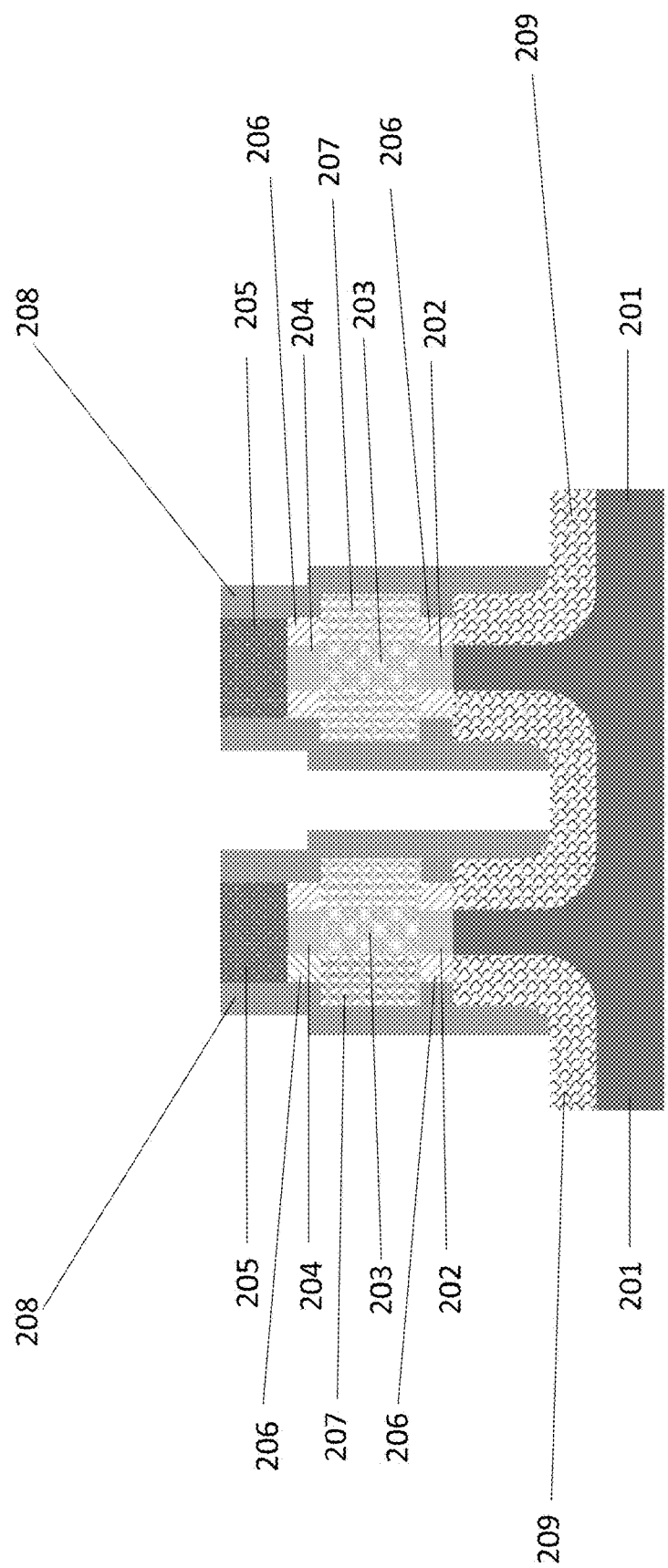
FIG. 8 illustrates a diagram of epitaxially growing a bottom source-drain region layer over the substrate of the first type.

FIG. 5 illustrates a diagram of performing oxidation to form $SiO_2$ 207 over the substrate of the first type 201 and the channel layer 203. The channel and bottom oxidation can use the regular dry oxidation process or a low temperature plasma oxidation process. FIG. 6 illustrates a diagram of depositing a dielectric liner and directionally etching it back 208 over the $SiO_2$ 207. FIG. 7 illustrates a diagram of etching $SiO_2$ 207 over the substrate of the first type 201. FIG. 8 illustrates a diagram of epitaxially growing a bottom source-drain region layer 209 over the substrate of the first type 201. The bottom source-drain region layer 209 can be a material such as silicon or silicon germanium. The bottom-source drain region layer 209 is positioned directly beneath dielectric inner spacer 206. This structure helps bottom junction formation with precisely-defined junction position.

Figure 9:
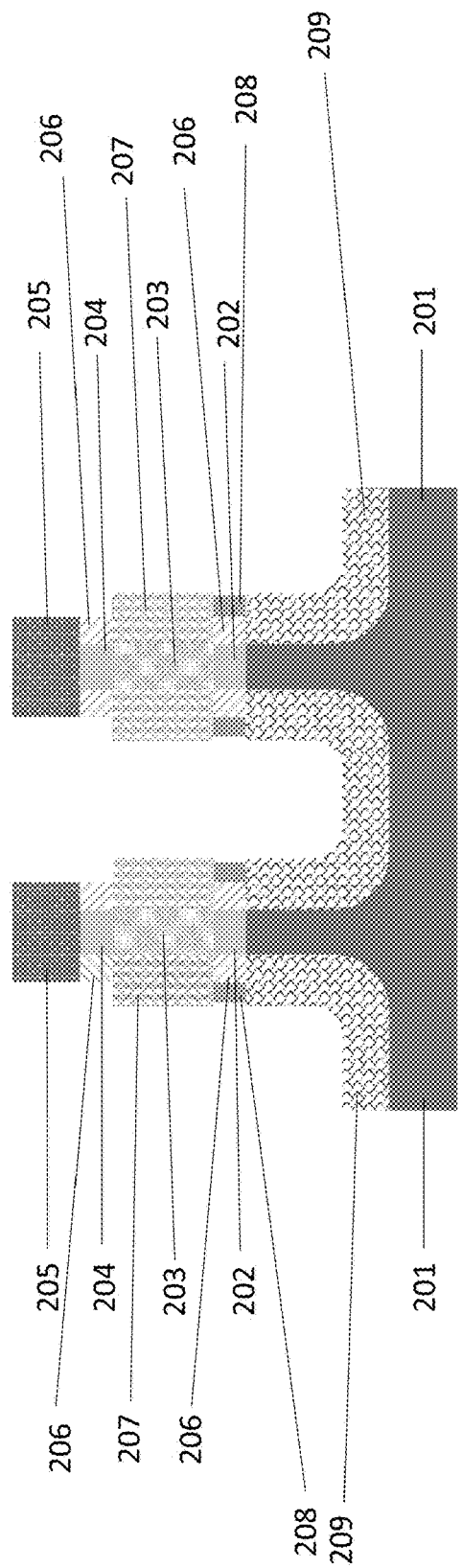
FIG. 9 illustrates a diagram of conformally etching back a hard mask liner over the bottom source-drain region layer.

FIG. 9 illustrates a diagram of conformally etching back the hard mask liner 208 over the bottom source-drain region layer 209. The hard mask liner 208 can be disposed on the sides of the dielectric inner spacer 206. The hard mask liner 208 can be silicon nitride. The key process that can enable precise defining of bottom junction is the oxidation process. The formed SiO₂ 207 over the substrate reserves space for the bottom source-drain region layer 209 such that the formed bottom source-drain region layer 209 is positioned directly beneath the dielectric inner spacer 206.

Figure 10:
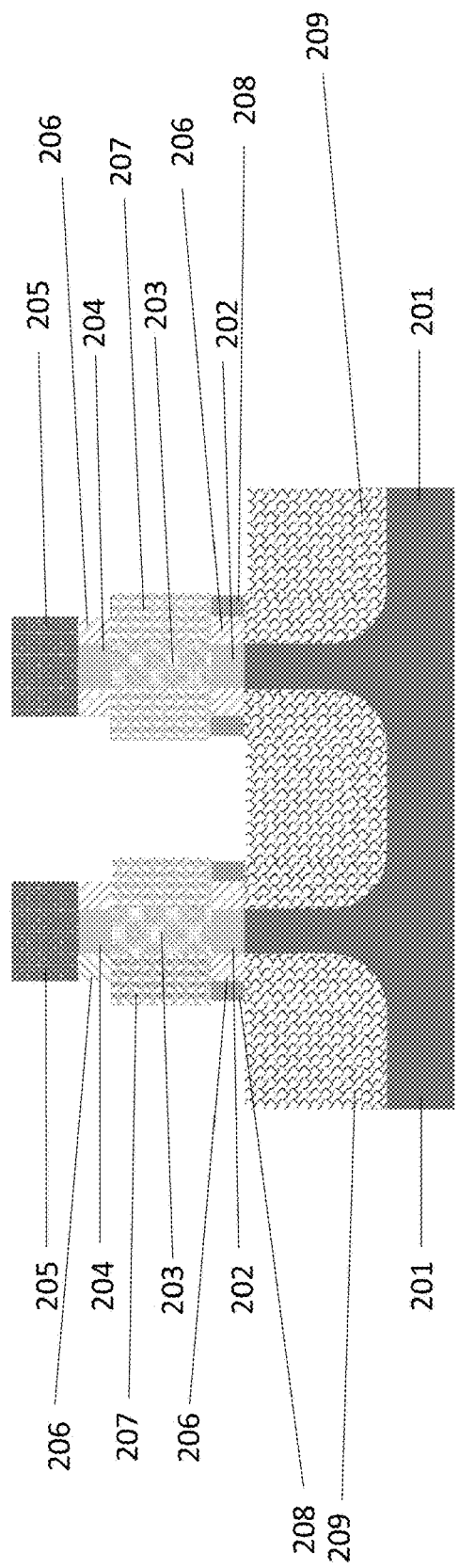
FIG. 10 illustrates a diagram of epitaxially growing additional bottom source-drain region layer.

FIG. 10 illustrates a diagram of epitaxially growing additional bottom source-drain region layer 209. The highly doped bottom source-drain region layer 209 can have a thickness of about 10 to about 50 nm and ranges there between. Dopant drive-in annealing process may be performed after bottom source-drain region layer 209 growth to form the bottom junction.

Figure 11:
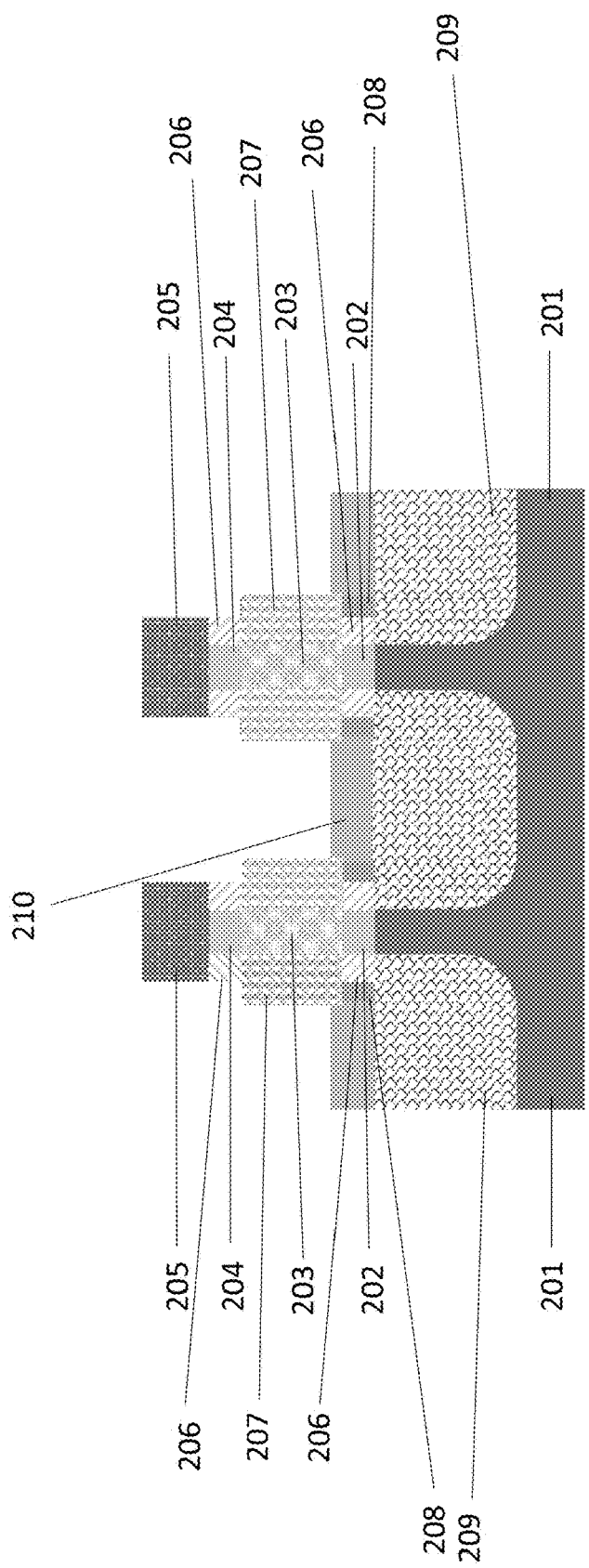
FIG. 11 illustrates a diagram of depositing an outer spacer on top of the bottom source-drain.
Figure 12:
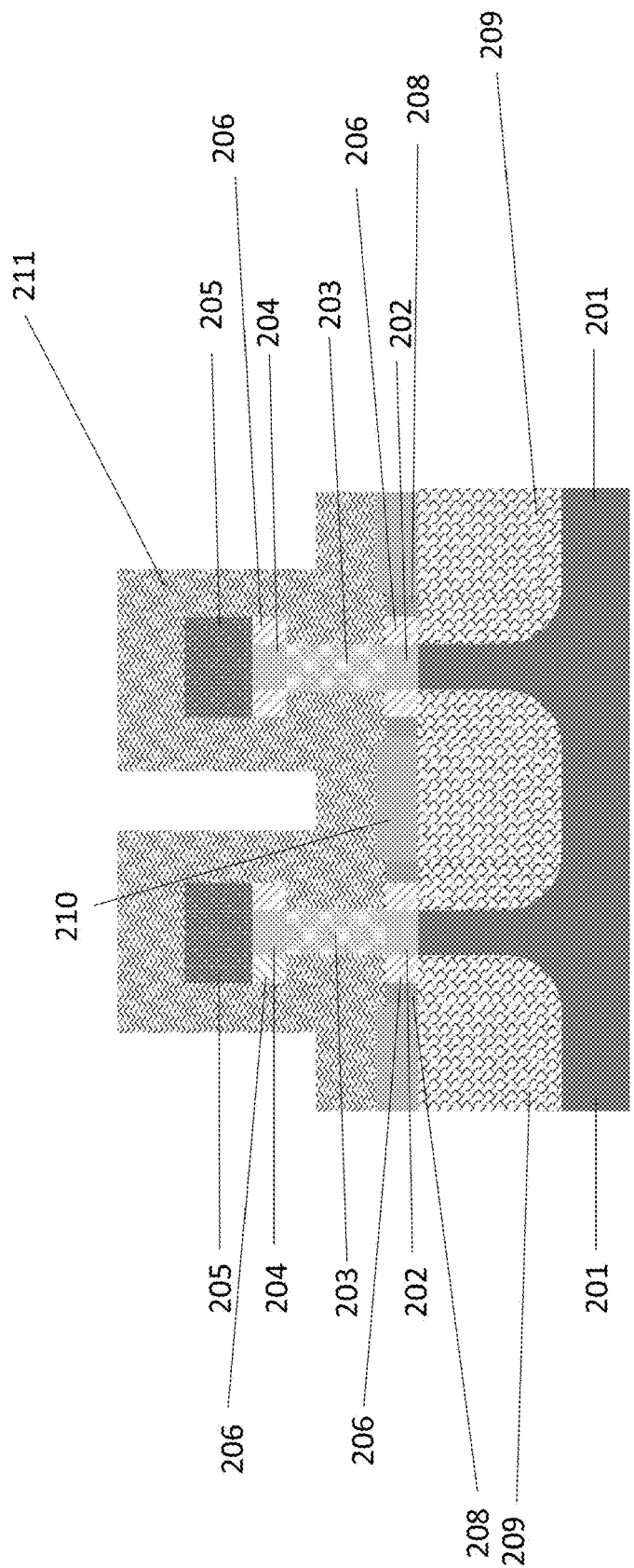
FIG. 12 illustrates a diagram of removing the $SiO_2$ and depositing a high-k dielectric layer and metal gate layer.
Figure 13:
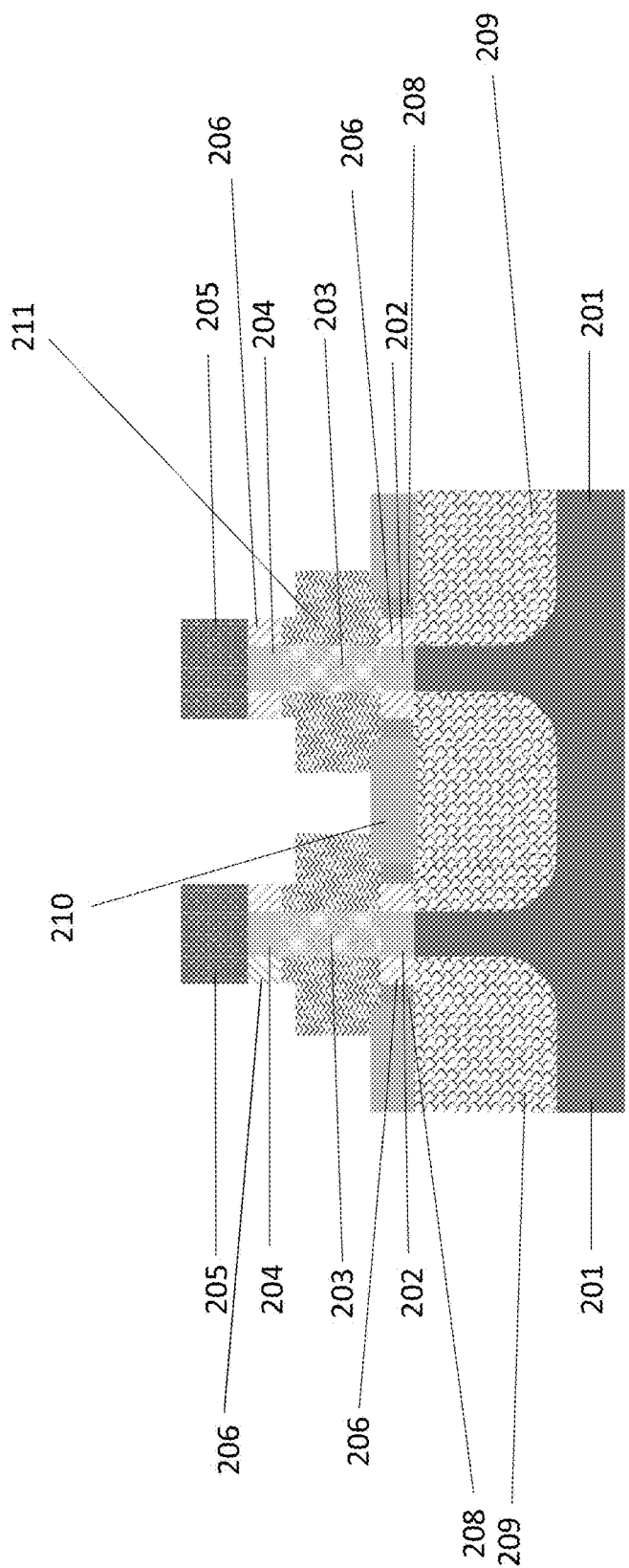
FIG. 13 illustrates a diagram of etching the high-k dielectric layer and metal gate layer to below the top hard mask.
Figure 14:
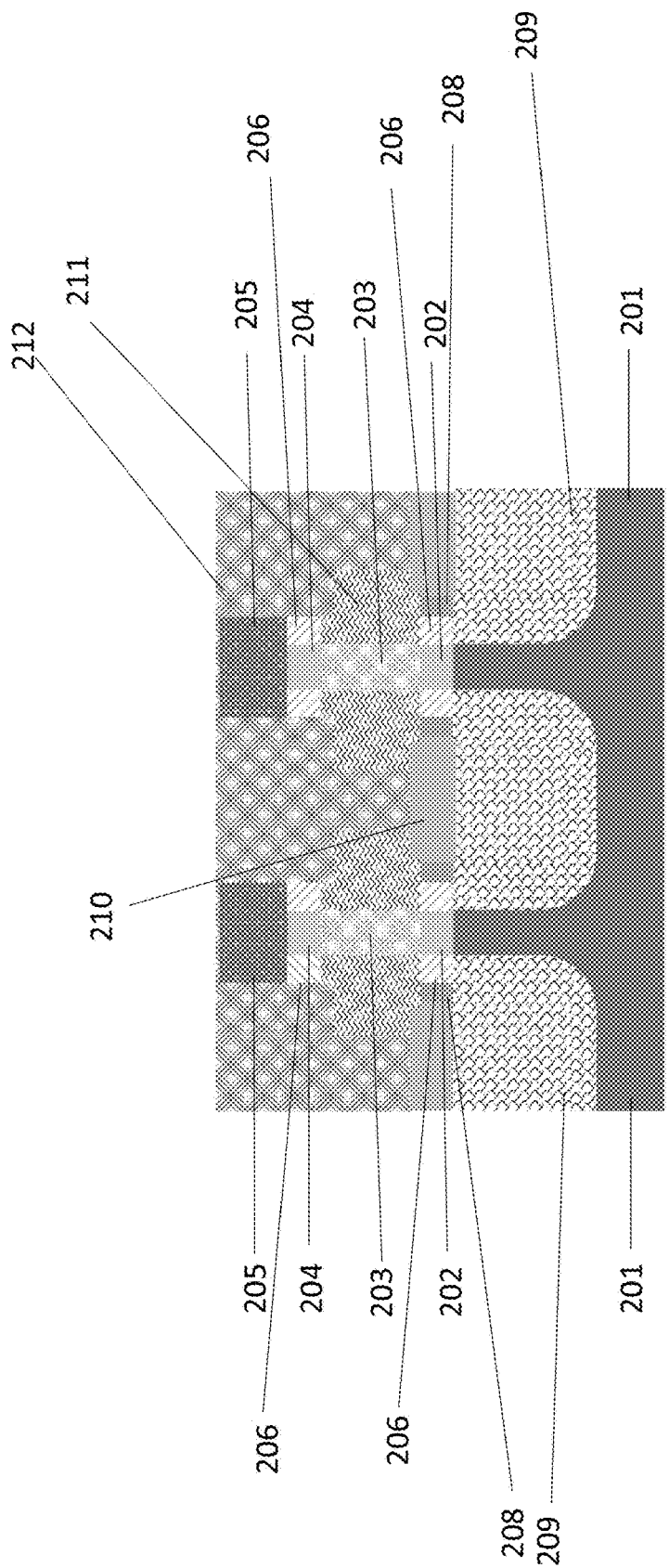
FIG. 14 illustrates a diagram of filling with interlayer dielectric (ILD) oxide and then performing CMP to the top of hard mask.

FIG. 11 illustrates a diagram of depositing an outer spacer 210 on top of the bottom source-drain region layer 209. The bottom outer spacer 210 is formed by anisotropic HDP deposition followed by conformal etching back. The bottom outer spacer 210 can be thicker than the dielectric inner spacer 206 to reduce capacitance. FIG. 12 removing SiO₂ 207 and depositing a high-k dielectric layer and metal gate layer 211. FIG. 13 illustrates a diagram of etching the high-k dielectric layer and metal gate layer 211 to below the top hard mask 205. FIG. 14 illustrates a diagram of filling with interlayer dielectric (ILD) oxide 212 and then performing CMP to the top of hard mask 205.

Figure 15:
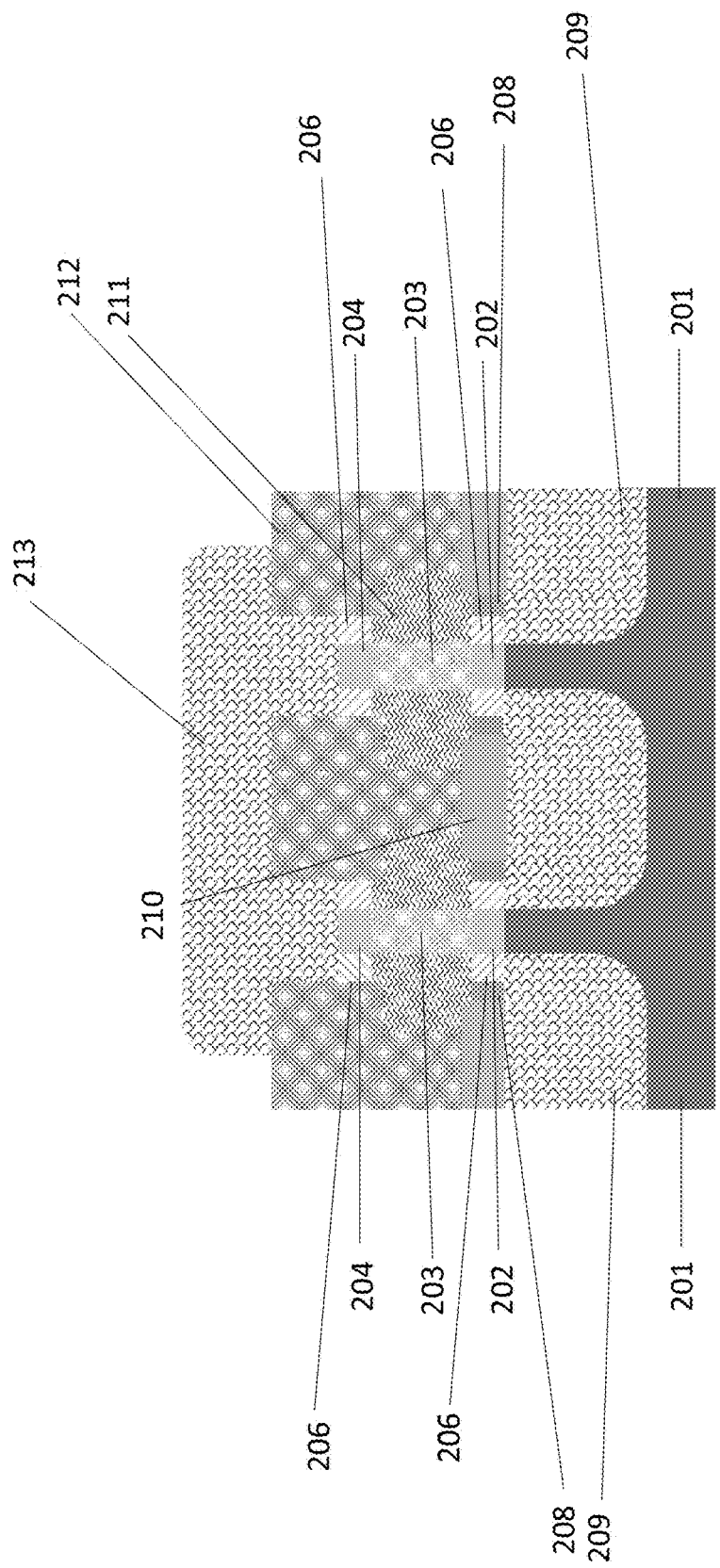
FIG. 15 illustrates a diagram of etching the hard mask; and epitaxially growing a top source-drain region layer over the first fin to produce the vertical FET.

FIG. 15 illustrates a diagram of etching the hard mask 205 and growing a top source-drain region layer 213 over the first fin to produce the vertical FET. The top source-drain region layer 213 can be a material such as silicon or silicon germanium. The gate contact is located out of the paper surface and therefore not shown. A first contact can be deposited on the top source-drain region layer and a second contact can be deposited on the bottom source-drain region layer to complete the final transistor.

What is claimed is:

1. A method of forming a vertical field-effect transistor (FET), the method comprising:
   depositing a first heterostructure layer over a substrate of a first type;
   depositing a channel layer over the first heterostructure layer;
   depositing a second heterostructure layer over the channel layer;
   forming a first fin having a hard mask thereon, wherein the hard mask is disposed on the second heterostructure layer;
   recessing the first and the second heterostructure layers such that they are narrower than the first fin and the hard mask;
   filling gaps formed in the recessed first and second heterostructure layers with a dielectric inner spacer;
   performing oxidation to form SiO₂ over the substrate of the first type and the channel layer;
   depositing a dielectric liner;
   directionally etching the dielectric liner over the SiO₂;
   etching the SiO₂ over the substrate of the first type;
   epitaxially growing a bottom source-drain region layer over the substrate of the first type;
   conformally etching back a hard mask liner over the bottom source-drain region layer;
   depositing an outer spacer on top of the bottom source-drain region layer;
   removing the SiO₂;
   depositing a high-k dielectric layer and metal gate layer on top of the first heterostructure layer;
   etching the high-k dielectric layer and metal gate layer to a level below the top hard mask;
   filling with interlayer dielectric (ILD) oxide and then performing CMP to the top of hard mask;
   etching the hard mask; and
   epitaxially growing a top source-drain region layer over the first fin to produce the vertical FET.

2. The method of forming a vertical FET of claim 1, wherein the first fin is formed by using a reactive ion etching (RIE) process.

3. The method of forming a vertical FET of claim 1, wherein the dielectric inner spacer is formed by conformal deposition and then conformal etch-back.

4. The method of forming a vertical FET of claim 1, wherein the channel and bottom oxidation is a low temperature plasma oxidation process.

5. The method of forming a vertical FET of claim 1, wherein the channel and bottom oxidation uses a regular dry oxidation process.

6. The method of forming a vertical FET of claim 1, wherein a first contact is deposited on the top source-drain region layer and a second contact is deposited on the bottom source-drain region layer to complete the final transistor.

7. The method of forming a vertical FET of claim 1, wherein the hard mask is etched selectively using hot phosphoric acid (H3PO4).

8. The method of forming a vertical FET of claim 1, where an additional bottom source-drain region layer is epitaxially grown prior to depositing an outer spacer on top of the bottom source-drain region layer.

9. The method of forming a vertical FET in claim 1, wherein a dopant drive-in annealing process is performed after the bottom source-drain region layer grows to form a bottom junction.

* * * * *